United States Patent
Tang

(10) Patent No.: US 7,697,343 B2
(45) Date of Patent: Apr. 13, 2010

(54) CIRCUIT AND METHOD FOR PRE-CHARGING FROM BOTH ENDS OF AN ARRAY IN A READ OPERATION IN NAND FLASH MEMORY

(75) Inventor: Qiang Tang, Fremont, CA (US)

(73) Assignee: Intel Corporation, Santa Clara, CA (US)

(*) Notice: Subject to any disclaimer, the term of this patent is extended or adjusted under 35 U.S.C. 154(b) by 106 days.

(21) Appl. No.: 11/862,905

(22) Filed: Sep. 27, 2007

(65) Prior Publication Data
US 2009/0086547 A1 Apr. 2, 2009

(51) Int. Cl.
*G11C 11/34* (2006.01)
*G11C 16/06* (2006.01)

(52) U.S. Cl. .................. 365/185.25; 365/203; 365/204

(58) Field of Classification Search ............ 365/185.25, 365/203, 204
See application file for complete search history.

(56) References Cited

U.S. PATENT DOCUMENTS 6,480,419 B2* 11/2002 Lee ...................... 365/185.18
6,707,738 B2* 3/2004 Choi et al. .................. 365/203
2006/0098508 A1* 5/2006 Choi et al. .................. 365/203
2006/0164890 A1* 7/2006 Lee ...................... 365/185.28
2007/0268750 A1* 11/2007 Suzuki et al. .......... 365/185.23

* cited by examiner

*Primary Examiner*—VanThu Nguyen
*Assistant Examiner*—R Lance Reidlinger
(74) *Attorney, Agent, or Firm*—Grossman, Tucker, Perreault & Pfleger, PLLC

(57) ABSTRACT

A circuit for performing a read operation in a NAND flash memory is disclosed. The NAND flash memory includes an array of bit lines grouped into first group of bit lines and second group of bit lines. The circuit includes a plurality of pre-charging and reading circuitries connected at first end of the array of bit lines and a plurality of pre-charging circuitries connected at second end of the array of bit lines. The pre-charging and reading circuitries include a select circuit which selects one group from the first and the second group of bit lines; a first and a second circuit to pre-charge and read the selected group of bit lines from the first end. The plurality of pre-charging circuits include two select lines to select one group of bit lines, and a plurality of pre-charging transistors to pre-charge the selected group of bit lines from the second end.

10 Claims, 5 Drawing Sheets

US 7,697,343 B2

CIRCUIT AND METHOD FOR PRE-CHARGING FROM BOTH ENDS OF AN ARRAY IN A READ OPERATION IN NAND FLASH MEMORY

FIELD

The present disclosure relates to flash memories and, more particularly, to a circuit and method for performing read operations in NAND flash memories.

BRIEF DESCRIPTION OF THE DRAWINGS

The advantages and features of the present disclosure will become better understood with reference to the following detailed description and claims taken in conjunction with the accompanying drawings, wherein like elements are identified with like symbols, and in which:

Like reference numerals refer to like parts throughout the description of several views of the drawings.

DETAILED DESCRIPTION OF THE DISCLOSURE

For a thorough understanding of the present disclosure, reference is to be made to the following detailed description, including the appended claims, in connection with the above-described drawings. Although the present disclosure is described in connection with exemplary embodiments, the disclosure is not intended to be limited to the specific forms set forth herein. It is understood that various omissions and substitutions of equivalents are contemplated as circumstances may suggest or render expedient, but these are intended to cover the application or implementation without departing from the spirit or scope of the claims of the present disclosure. Also, it is to be understood that the phraseology and terminology used herein is for the purpose of description and should not be regarded as limiting.

The terms "first," "second," and the like, herein do not denote any order, quantity, or importance, but rather are used to distinguish one element from another. The terms "a" and "an" herein do not denote a limitation of quantity, but rather denote the presence of at least one of the referenced item. The term 'asserted' used herein with reference to a signal denote a state of the signal, in which the signal is active and which can be achieved by applying any logic level either logic 0 or logic 1 to the signal.

Figure 1:
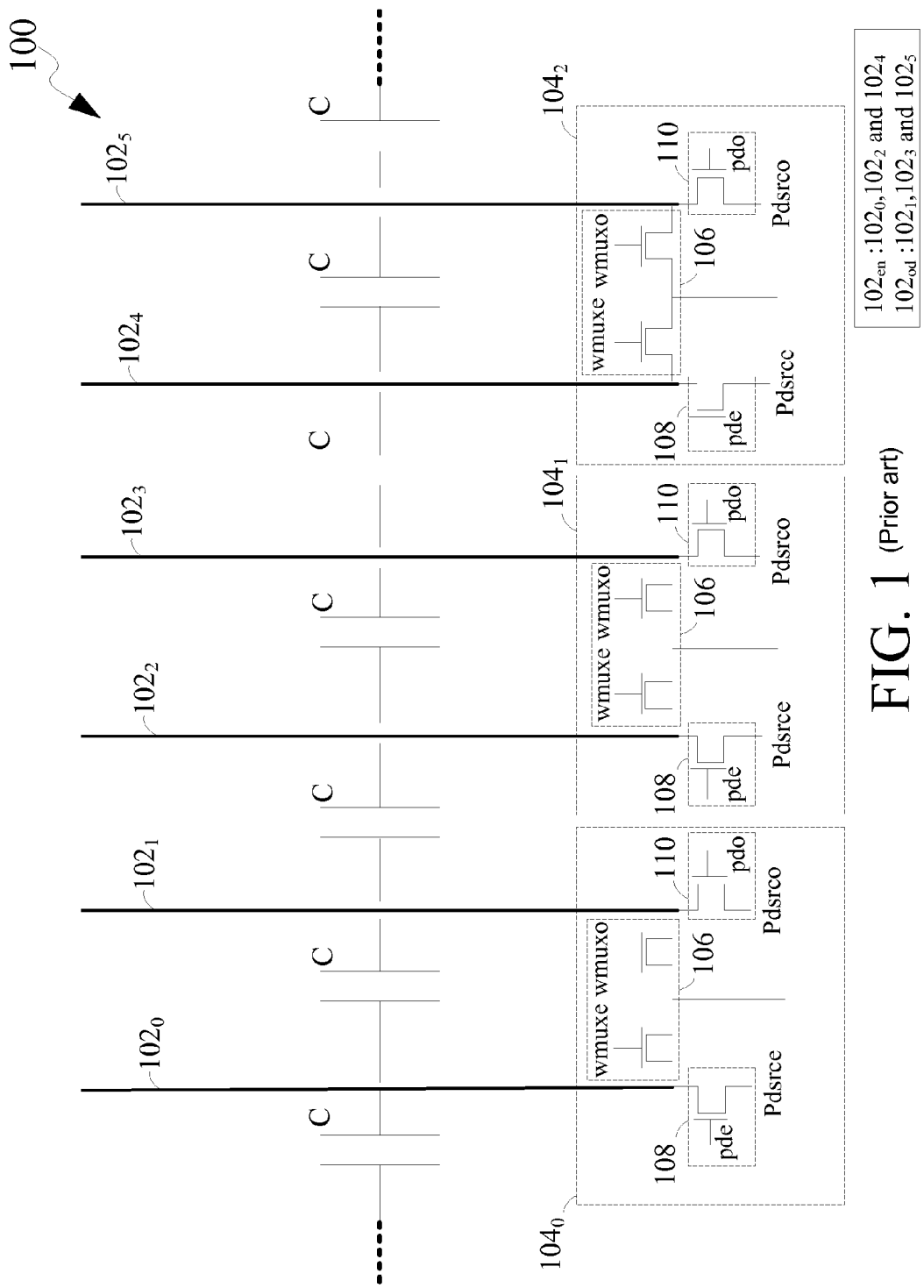
FIG. 1 is a circuit diagram illustrating a prior art circuit used for a read operation in a NAND flash memory.

FIG. 1 is a circuit diagram illustrating a prior-art circuit 100 used in a read operation in a NAND flash memory. The prior-art circuit 100 includes an array of bit lines 102 ($102_0$, $102_1$ . . . , $102_5$) and a plurality of pre-charging and reading circuitries 104 ($104_0$, $104_1$, and $104_2$). The plurality of pre-charging and reading circuitries 104 are hereinafter referred to as 'circuitries 104'. For the sake of simplicity, only six bit lines are shown in the array of bit lines 102 in FIG. 1, although any number of bit lines may be present in the NAND flash memory. Similarly, the number of pre-charging and reading circuitries in the circuitries 104 may also vary from what is shown in FIG. 1. The array of bit lines 102 are grouped in two groups. A first group of bit lines $102_{en}$ include bit lines $102_0$, $102_2$, and $102_4$ and a second group of bit lines $102_{od}$ include bit lines $102_1$, $102_3$, and $102_5$. In one embodiment of the present disclosure, the first group of bit lines $102_0$, $102_2$, and $102_4$, hereinafter referred to as 'bit lines $102_{en}$', is even numbered bit lines and the second group of bit lines $102_1$, $102_3$, and $102_5$, hereinafter referred to as 'bit lines $102_{od}$', is odd numbered bit lines. The read operation in the prior-art circuit 100 comprises reading one group of bit lines selected from the bit lines $102_{en}$ and the bit lines $102_{od}$. When reading of the one group of bit lines is performed, the other group of bit lines acts as a shielding line.

Each of the plurality of pre-charging and reading circuitries 104 comprises a select circuit 106, a first circuit 108 and a second circuit 110. The select circuit 106 is connected between two adjacent bit lines of the array of bit lines 102. For example, as shown in FIG. 1, the select circuit 106 is connected between a first bit line $102_0$, and second bit line $102_1$ of the two adjacent bit lines. The first bit line $102_0$ is part of the bit lines $102_{en}$ and the second bit line $102_1$ is part of the bit lines $102_{od}$. Similarly, the select circuit 106 is also connected between a pair of adjacent bit lines $102_2$ and $102_3$, and between a pair of adjacent lines $102_4$ and $102_5$. As explained above, the group of the first bit lines $102_0$, $102_2$, and $102_4$ forms the bit lines $102_{en}$. Similarly, the group of the second bit lines $102_1$, $102_3$, and $102_5$ forms the bit lines $102_{od}$. The select circuit 106 may be implemented by a multiplexer or a decoder. The select circuit 106 is used for selecting one group of bit lines from the bit lines $102_{en}$ and the bit lines $102_{od}$ based on signals wmuxe and wmuxo. In one embodiment of the present disclosure, the bit lines $102_{en}$ are selected when the signal wmuxe is asserted, and the bit lines $102_{od}$ are selected when the signal wmuxo is asserted.

The first circuit 108 is connected to each bit line of the bit lines $102_{en}$ and the second circuit 110 is connected to the each bit line of the bit lines $102_{od}$. The circuit 108 performs the biasing of the bit lines $102_{en}$ when the select circuit 106 selects the bit lines $102_{od}$ by asserting the wmuxo signal. Similarly, the circuit 110 performs the biasing of the bit lines $102_{od}$ when the select circuit 106 selects the bit lines $102_{en}$ by asserting the wmuxe signal. The pre-charging and sensing operation is performed on the selected bitlines through circuit 106.

The prior-art circuit 100 in a typical NAND flash memory augments a plurality of limitations. For example, with an increase in a bit line density in the NAND flash memory, a bit line resistance (R) and a bit line-bit line coupling capacitance (C) also increases. A large value of the R and the C leads to a large bit line pre-charge time, as the bit line pre-charge time is proportional to an RC time constant. As apparent to a person skilled in the art that the bit lines $102_{en}$ and the bit lines $102_{od}$ are parallel and are coupled up higher at an end far from an end where the circuitries 104 are connected. For the sake of simplicity, the end of the array bit lines 102, where the circuitries 104 are connected may be referred to as a 'first end' and the end opposite to first end may be referred to as a 'second end'. Considering a case when the bit lines $102_{en}$ are pre-charged and read from the first end and when the pre-charging is stopped, the voltage level at the bit lines $102_{en}$ may be coupled down by the bit lines $102_{od}$ from the second end.

Figure 2:
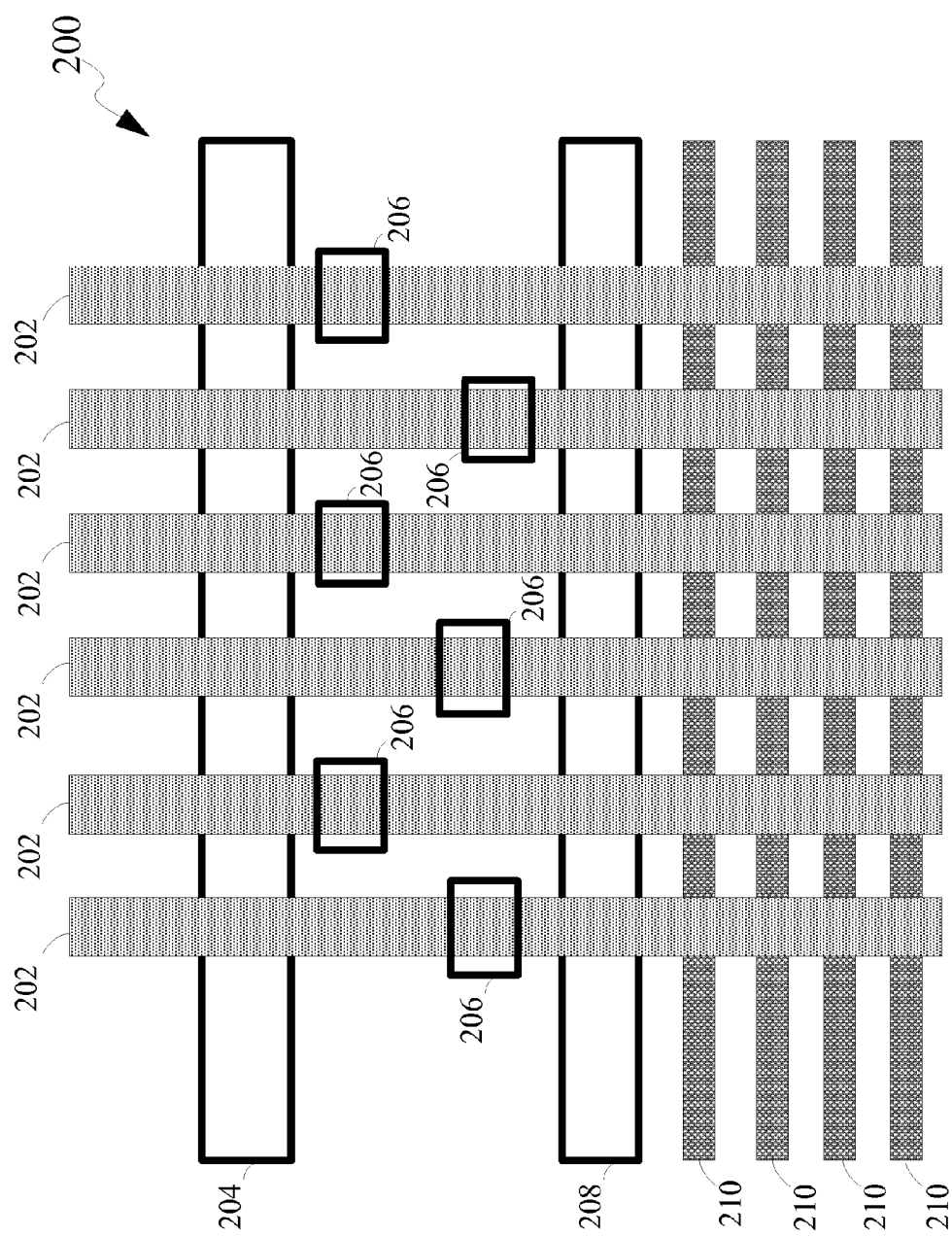
FIG. 2 is a circuit layout diagram illustrating a layout of one end of the circuit of FIG. 1.

FIG. 2 is a circuit layout diagram illustrating an exemplary layout 200 of a side at the second end of the prior-art circuit 100 shown in FIG. 1. The layout structure 200 comprises bit line layouts 202, a dummy sgd layout 204, staggered bit line contact layouts 206, an active sgd layout 208 and word line layouts 210. The bit line layouts 202 represent layout for the array of bit lines 102. The dummy sgd layout represents a layout for a dummy sgd. The active sgd layout corresponds to a layout of a gate select line for an active bit line. The active bit line may be of a group of bit lines from the bit lines $102_{en}$ and the bit lines $102_{od}$.

Figure 3:
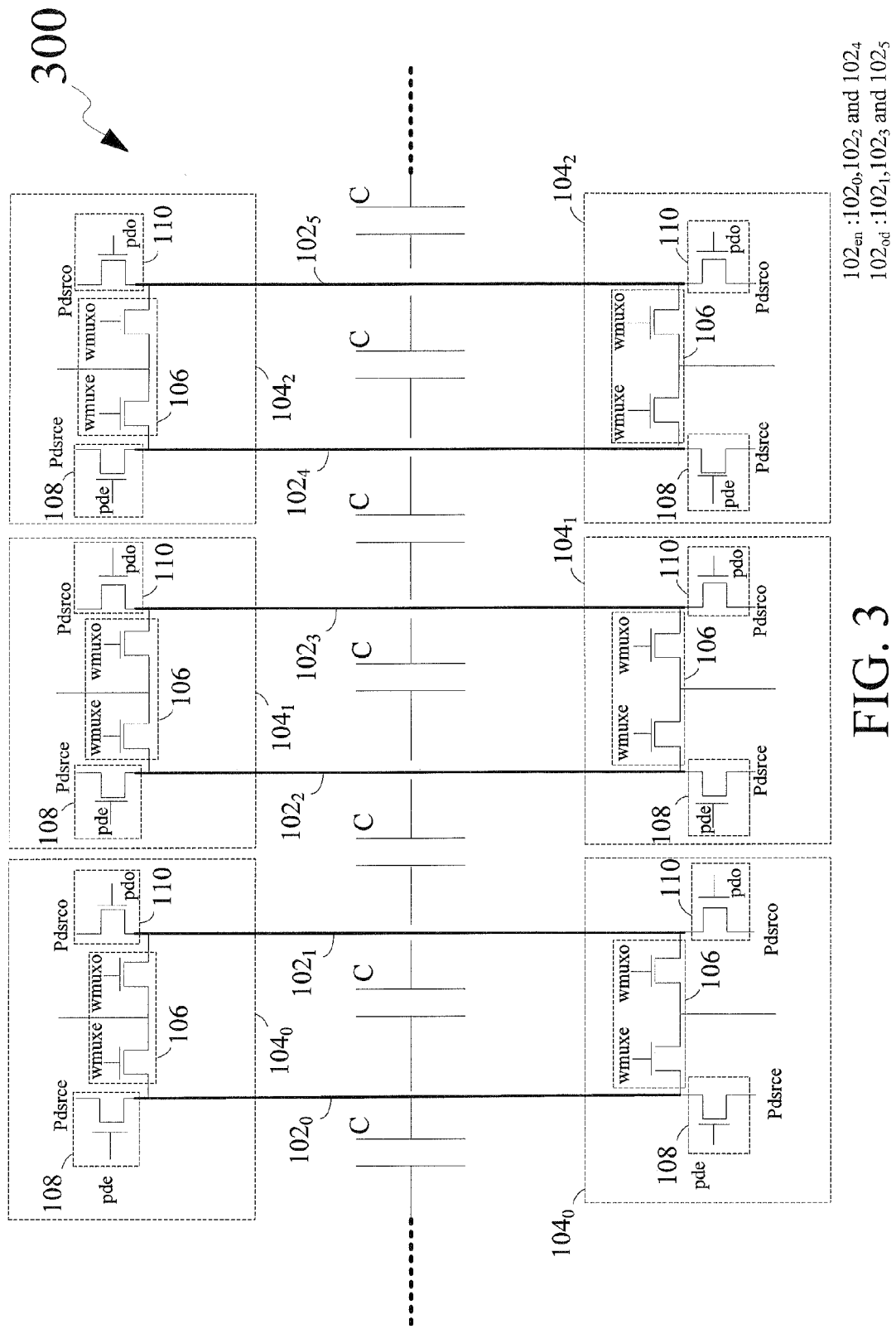
FIG. 3 is a circuit diagram illustrating a circuit used in a NAND flash memory, according to an exemplary embodiment of the present disclosure.

FIG. 3 is a circuit diagram illustrating a circuit 300 used in a NAND flash memory, according to an exemplary embodiment of the present disclosure. For the sake of simplicity, the components such as the array of bit lines 102, the circuitries 104, the select circuit 106, the first circuit 108 and the second circuit 110 represent the same components as shown in FIG. 1 and their functionalities are similar. Accordingly, the aforesaid components are herein represented by same reference numerals. The circuit 300 comprises the circuitries 104 connected at the first end as well as at the second end of the array of bit lines 102. In this manner, the array of bit lines 102 may be pre-charged from both the first end and the second end. Due to the pre-charging phenomenon from both the first end and the second end, the circuit 300 eliminates the limitations of the prior-art circuit 100 as described in conjunction with FIG. 1. However, in this exemplary embodiment of the present disclosure, adding the circuitries 104 at the second end may lead to an increase in an area cost. The present disclosure further provides an equivalent circuit representation of the circuit 300 that minimizes the area cost, which will be described in conjunction with FIG. 5.

Figure 4:
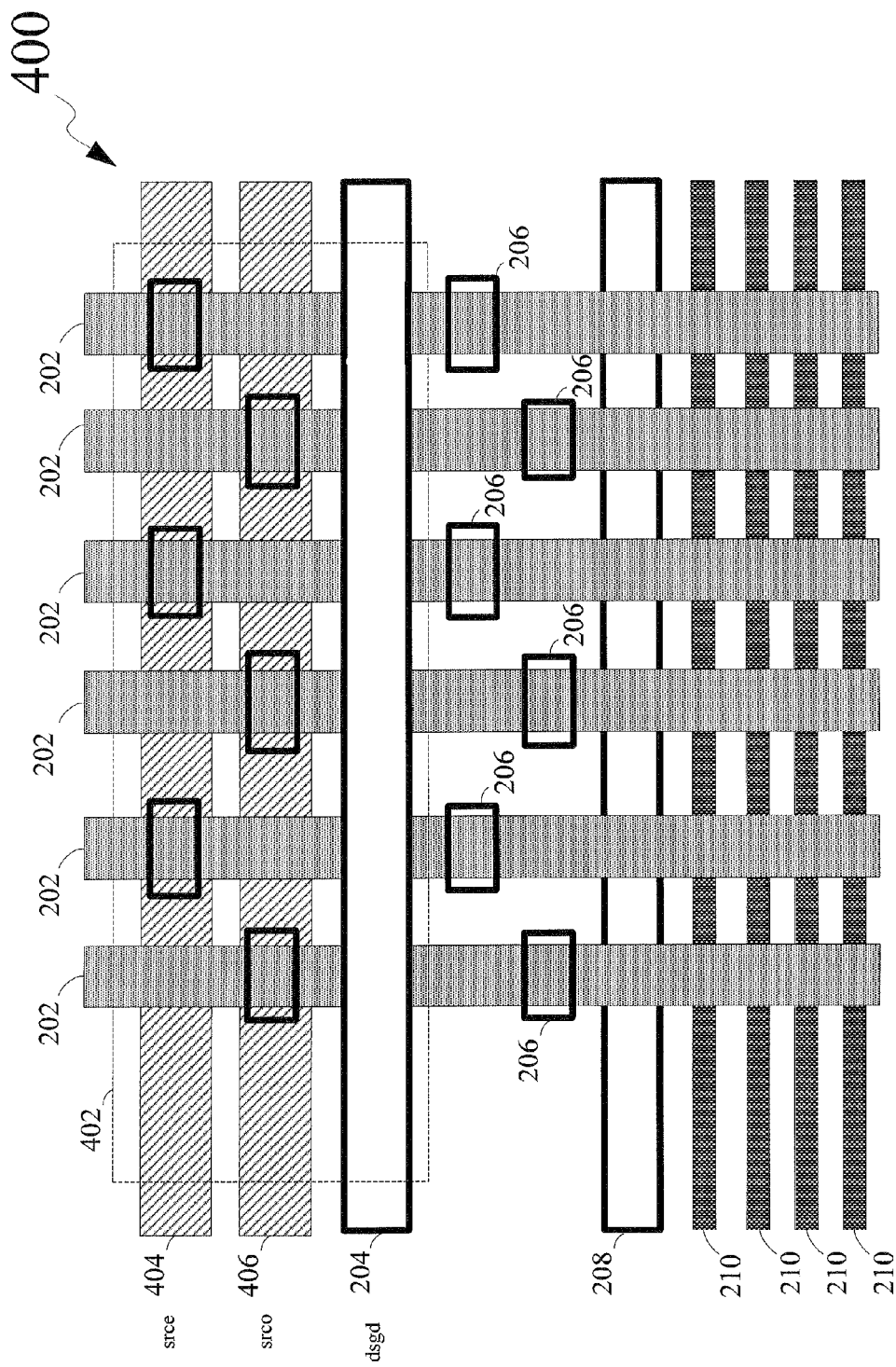
FIG. 4 is a circuit layout diagram illustrating a layout of one end of the circuit used in the NAND flash memory of FIG. 3, according to an exemplary embodiment of the present disclosure.

FIG. 4 is a circuit layout diagram illustrating a layout 400 of a side at the second end of the circuit 300, according to an exemplary embodiment of the present disclosure. For the sake of simplicity, same reference numerals in FIG. 4 represent same components as shown in FIG. 2. Accordingly, the components already described in FIG. 2 are not described again. The layout 400 includes a layout 402 in addition to the bit lines layout 202, the dummy SGD 204, the staggered bit line contacts layout 206, the active SGD layout 208 and the word lines layout 210 as described in FIG. 2. The layout 402 represents the layout for the circuitries 502 at the second end of the circuit 500 (see FIG. 5). The layout 402 includes a srce layout 404, a srco layout 406 and a dsgd layout 204. The srce layout 404 corresponds to a common biasing line for the bit lines $102_{en}$ and the srco layout 406 corresponds to a common biasing line for the bit lines $102_{od}$. A circuit 500 equivalent to the circuit 300 may be generated from the layout 402, which is described in conjunction with FIG. 5. It may be observed from the foregoing that the Dummy sgd 204 in FIG. 2 may be solely used for helping processing of the last active sgd 208 and may have no electric function. The dsgd 204 in FIG. 4 may not only used for helping processing of the last array sgd 208, but may also be used to control passing of srce voltage to even bitlines and passing of srco voltage to odd bitlines.

Figure 5:
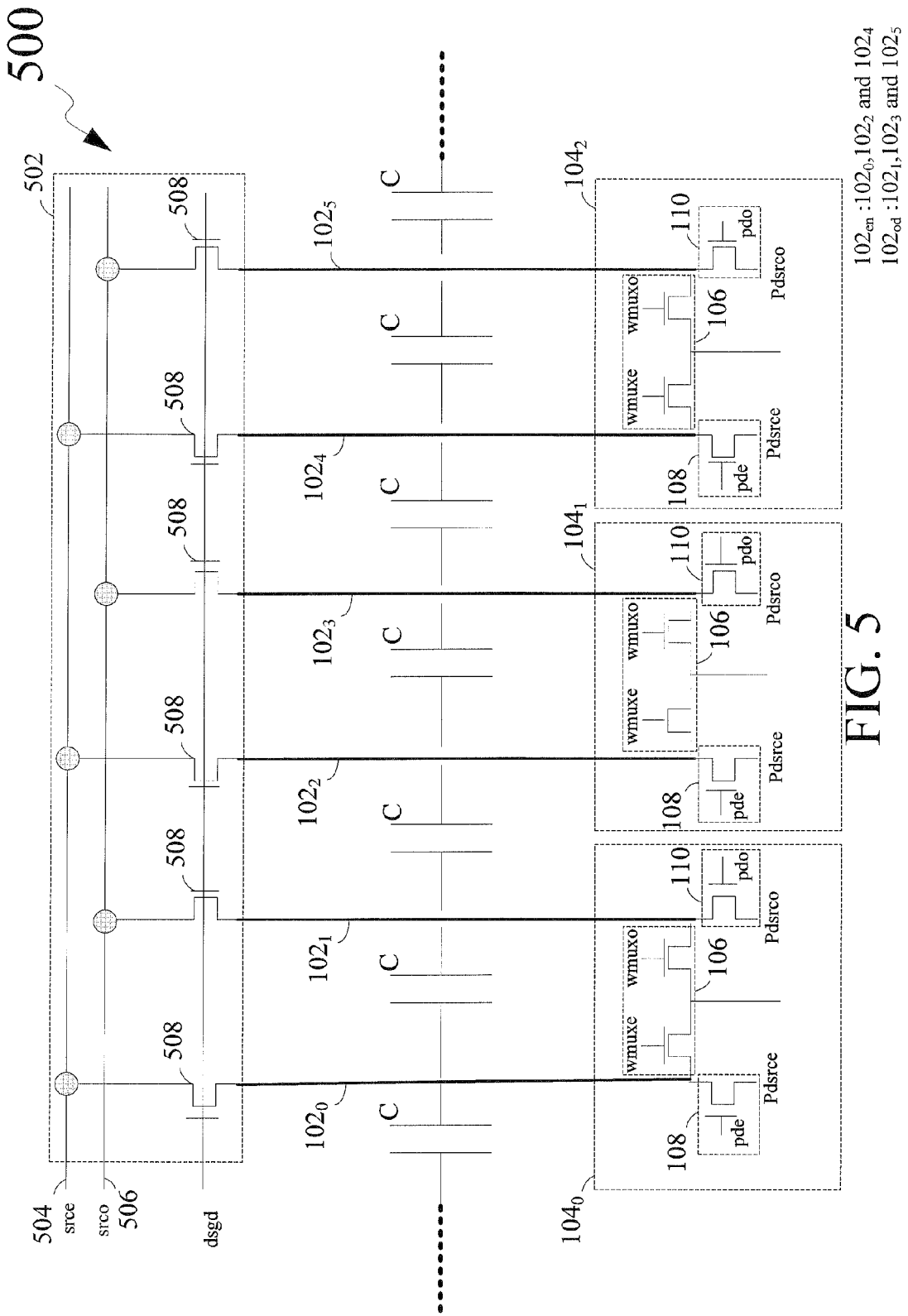
FIG. 5 is a circuit diagram illustrating a simplified circuit used in the NAND flash memory, according to another exemplary embodiment of the present disclosure.

FIG. 5 is a circuit diagram illustrating a circuit 500 used for the read operation in the NAND flash memory, according to another exemplary embodiment of the present disclosure. (FIG. 5 should correspond to FIG. 4, as the same implementation.) The circuit 500 is a simplified circuit derived from the circuit 300 based on an objective of area minimization at the second end of the array of bit lines 102. In FIG. 5, the reference numerals represent the same components as described in conjunction with FIG. 1. The circuit 500 is similar to the configuration of the circuit 300 at the first end of the array of bit lines 102. However, at the second end of the array of bit lines 102, a plurality of pre-charging circuitries 502 are connected. The pre-charging circuitries 502 comprise a first biasing line 504, a second biasing line 506 and a plurality of pre-charging transistors 508.

The objective of the pre-charging circuitries 502 is to pre-charge one of the bit lines $102_{en}$ and the bit lines $102_{od}$ to different voltages at the same time. The first biasing line 504 is connected to the each bit line of the bit lines $102_{en}$ and the second biasing line is connected to the each bit line of the bit lines $102_{od}$. From FIG. 5, it will be obvious to a person skilled in the art that when at the second end of the array of bit lines 102, a biasing signal srce is asserted, the bit lines $102_{en}$ are precharged to the voltage of srce when dsgd voltage is high enough to turn on the dsgd MOSFET's. Similarly, the bit lines $102_{od}$ are biased when a select signal srco is asserted and the dsgd voltage is high enough to turn on the dsgd MOSFET's. The pre-charging of the array of bit lines 102 is performed through the plurality of pre-charging transistors 508. Each of the plurality of pre-charging transistors 508 is coupled between a bit line and one of the first select line 504 and the second select line 506. There is a common gate input for the each of the plurality of pre-charging transistors 508. The plurality of pre-charging transistors 508 is connected such that drain of the each pre-charging transistor 508 is connected to the one of the first select line 504 and the second select line 506, and source of the each pre-charging transistor 508 is connected to a bit line of the array of bit lines 102.

The read operation in the circuit 500 may be explained with the following method. The method comprises selecting a group of bit lines from the bit lines $102_{en}$ and the bit lines $102_{od}$ for performing the read operation at a first end of the array of bit lines 102. Further, the method comprises pre-charging the selected group and the unselected group of bit lines from the first end of the array of bit lines 102. For example as shown in FIG. 5, when the bit lines $102_{en}$ are the selected group of bit lines, the first circuits 106 pre-charge the bit lines $102_{en}$ from the first end by applying high voltage on wmuxe to turn on those MOSFET's while applying zero volts on wmuxo to turn off those MOSFET's. At the same time bitlines 102od are precharged through circuit 110 by applying high voltage on pdo. Also at the same time, the bit lines $102_{en}$ are precharged from the second end through the first biasing line 504 to the same voltage as from the first end (usually ~0.5V) while bitlines 102od are precharged from the second end through the second biasing line 506 to the same voltage as from the first end (usually 0 v). During this precharge time, high voltage is applied to dsgd (for example 3V) to turn on those MOSFET's. After the precharging is finished, i.e. the bitline voltage stabilizes, the dsgd voltage to reduced to such that the dsgd devices only pass the low voltage (usually 0 v) applied to the unselected bitlines while blocking the high voltage (usually 0.5V) initially connected the selected bitlines. Then the selected bitlines can be discharged by the selected memory cells and therefore sensed, while the unselected bitlines are still being held from both ends to work as virtual ground. In an embodiment of the present disclosure, the pre-charging of the bit lines $102_{en}$ includes biasing the signal srce to a pre-charge voltage and biasing the signal srco to a pre-defined voltage. In this embodiment, the pre-defined voltage may be of a ground level. In another embodiment of the present disclosure, the pre-charging of the bit lines $102_{en}$ includes biasing the signal srce to a supply voltage and biasing the signal srco to the ground level. Thereafter, the method comprises reading of the bit lines $102_{en}$ from the first end using the first circuit 106.

The foregoing descriptions of specific embodiments of the present disclosure have been presented for purposes of illustration and description. They are not intended to be exhaustive or to limit the disclosure to the precise forms disclosed, and obviously many modifications and variations are possible in light of the above teaching. The embodiments were chosen and described in order to best explain the principles of the disclosure and its practical application, to thereby enable others skilled in the art to best utilize the disclosure and various embodiments with various modifications as are suited to the particular use contemplated. It is understood that various omission and substitutions of equivalents are contemplated as circumstance may suggest or render expedient, but such are intended to cover the application or implementation without departing from the spirit or scope of the claims of the present disclosure.

What is claimed is:

1. A circuit for performing a read operation in a NAND flash memory, the NAND flash memory comprising an array of bit lines, the array of bit lines grouped in a first group of bit lines and a second group of bit lines, the circuit comprising:
    a plurality of pre-charging and reading circuitries coupled to a first end of the array of bit lines, each of the plurality of pre-charging and reading circuitries comprising
        a select circuit connected between two adjacent bit lines of the array of bit lines, the select circuit configured to select one of a first bit line and a second bit line of the two adjacent bit lines, wherein the first bit line of the two adjacent bit lines is a part of the first group of bit lines and wherein the second bit line of the two adjacent bit lines is a part of the second group of bit lines,
        a first circuit connected to the first bit line of the two adjacent bit lines, the first circuit configured to pre-charge and read the first bit line, and
        a second circuit connected to the second bit line of the two adjacent bit lines, the second circuit configured to pre-charge and read the second bit line; and
    a plurality of pre-charging circuitries coupled to a second end of the array of bit lines, the plurality of pre-charging circuitries comprising
        a first select line connected to the first group of bit lines of the array of bit lines for selecting the first group of bit lines,
        a second select line connected to the second group of bit lines of the array of bit lines for selecting the second group of bit lines, and
        a plurality of pre-charging transistors, each of the plurality of pre-charging transistors coupled between a bit line and one of the first select line and the second select line, wherein the plurality of pre-charging circuitries is configured to simultaneously pre-charge the first group of bit lines and the second group of bit lines to different voltages.

2. The circuit of claim 1, wherein the first group of bit lines comprises even numbered bit lines of the array of bit lines.

3. The circuit of claim 1, wherein the second group of bit lines comprises odd numbered bit lines of the array of bit lines.

4. The circuit of claim 1, wherein the each of the plurality of pre-charging transistors has a drain, a source and a gate, and wherein the drain is connected to one of the first select line and the second select line, the source is connected to the bit line and gates of the each of the plurality of pre-charging transistors have a common input.

5. The circuit of claim 1, wherein the select circuit is one of a multiplexer and a decoder.

6. A method for performing a read operation in a NAND flash memory, the NAND flash memory comprising an array of bit lines, the array of bit lines grouped in a first group of bit lines and a second group of bit lines, the method comprising:
    selecting one group of bit lines from the first group of bit lines and the second group of bit lines for performing the read operation at a first end of the array of bit lines;
    pre-charging the selected group of bit lines from the first end of the array of bit lines;
    pre-charging the selected group of bit lines from a second end of the array of bit lines;
    pre-charging the unselected group of bit lines from the second end of the array of bit lines to a different voltage than the selected group of bit lines, simultaneously with the selected group of bit lines; and
    reading the selected group of bit lines from the first end of the array of bit lines.

7. The method of claim 6, further comprising selecting the selected group of bit lines at the second end of the array of bit lines prior to pre-charging the selected group of bit lines from the second end.

8. The method of claim 6, wherein pre-charging the selected group of bit lines from the second end comprises applying a pre-defined voltage at the unselected group of bit lines.

9. The method of claim 6, wherein the first group of bit lines comprises even numbered bit lines of the array of bit lines.

10. The method of claim 6, wherein the second group of bit lines comprises odd numbered bit lines of the array of bit lines.

* * * * *